US008463567B2

(12) United States Patent
Runkle

(10) Patent No.: US 8,463,567 B2
(45) Date of Patent: *Jun. 11, 2013

(54) PRESENTATION OF UNBALANCE INFORMATION FOR ELECTRICAL ASSET MANAGEMENT

(75) Inventor: Mark Andrew Runkle, Schenectady, NY (US)

(73) Assignee: General Electric Company, Schenectady, NY (US)

( * ) Notice: Subject to any disclaimer, the term of this patent is extended or adjusted under 35 U.S.C. 154(b) by 0 days.

This patent is subject to a terminal disclaimer.

(21) Appl. No.: 13/523,043

(22) Filed: Jun. 14, 2012

(65) Prior Publication Data

US 2012/0253718 A1 Oct. 4, 2012

Related U.S. Application Data

(63) Continuation of application No. 12/750,790, filed on Mar. 31, 2010, now Pat. No. 8,234,088.

(51) Int. Cl.
*G01R 19/00* (2006.01)
*G06F 11/30* (2006.01)

(52) U.S. Cl.
USPC .............. 702/64; 702/182; 702/183; 702/188

(58) Field of Classification Search
USPC ...................... 702/64–69, 121–123, 182–188
See application file for complete search history.

(56) References Cited

U.S. PATENT DOCUMENTS 5,995,347 A * 11/1999 Rudd et al. .................... 361/24
7,539,549 B1 * 5/2009 Discenzo et al. ............. 700/28

OTHER PUBLICATIONS

GE Multilin, "469 Motor Management Relay Instruction Manual", Copyright 2008 GE Multilin, 248 pages, 469 Firmware Revision 30E29x.000, 469 PC Software Revision 2.9x, Manual P/N: 1601-0057-DH (GEK-106289J), Canada.
GE Multilin, "469 Motor Management Relay Instruction Manual", Copyright 2009 GE Multilin, 338 pages, Software Revision 5.0x, Manual P/N: 1601-0122-A8 (GEK-106474G), http://www.gedigitalenergy.com/products/manuals/469/469man-a8.pdf on Mar. 30, 2010, Canada.
ABB, "Low Voltage Products: Motor Protection Relay, SPEM", 2006, pp. 1-12, retrieved from: http://www05.abb.com/global/scot/scot209.nsf/veritydisplay/97ce945af02da944c1256c550026966f/$File/SPEM1GB01_06.pdf on Mar. 30, 2010, Finland.
GE, "Industry Leading Protection & Control: Ensuring the integrity of the world's power systems", 3 pages, retrieved from: http://www.gedigitalenergy.com/protection_control.htm on Mar. 30, 2010.

(Continued)

*Primary Examiner* — Phuong Huynh
(74) *Attorney, Agent, or Firm* — Hoffman Warnick LLC; Ernest G. Cusick

(57) ABSTRACT

Disclosed herein is an approach that presents unbalance information obtained from electrical assets in a manner that facilitates management of the electrical assets. In one aspect, a screen view is generated that provides a visual representation of the electrical assets as partitioned into one or more groupings that are each based on a common operational characteristic associated with the electrical assets. The screen view also contains unbalance information that is associated with each of the electrical assets in the one or more groupings and an indication of whether there is a presence of abnormal operation associated with each of the one or more groupings.

20 Claims, 7 Drawing Sheets

OTHER PUBLICATIONS

GE Multilin, "Motor Protection Principles", p. 1, Copyright 2010, retrieved from: http://www.gedigitalenergy.com/multilin/family/motors/principles.htm on Mar. 30, 2010.

GE Multilin, "Motor Protection Principles", p. 2, Copyright 2010, retrieved from: http://www.gedigitalenergy.com/multilin/family/motors/principles2.htm on Mar. 30, 2010.

GE Multilin, "Motor Protection Principles", p. 3, Copyright 2010, retrieved from: http://www.gedigitalenergy.com/multilin/family/motors/principles3.htm on Mar. 30, 2010.

GE Multilin, "Motor Protection Principles", p. 4, Copyright 2010, retrieved from: http://www.gedigitalenergy.com/multilin/family/motors/principles4.htm on Mar. 30, 2010.

Venkataraman et al., "Fundamentals of a Motor Thermal Model and its Applications in Motor Protection", pp. 41-55, Date Unknown, retrieved from: http://www.geindustrial.com/pm/family/motors/Motor_Thermal_Model.pdf on Mar. 30, 2010.

Square D: Product Data Bulletin, "Developments in Motor Protection: White Paper", pp. 1-12, Jan. 1996, Bulletin No. 9065PD9501, retrieved from: http://ecatalog.squared.com/techlib/docdetail.cfm?oid=0900892680079307 on Mar. 30, 2010, North Carolina.

Huynh, Office Action Communication for U.S. Appl. No. 12/750,790 dated Jan. 6, 2012, 10 pages.

Huynh, Notice of Allowance and Fee(s) due for U.S. Appl. No. 12/750,790 dated Jan. 6, 2012, 10 pages.

* cited by examiner

PRESENTATION OF UNBALANCE INFORMATION FOR ELECTRICAL ASSET MANAGEMENT

CROSS-REFERENCE TO RELATED APPLICATIONS

This application is a continuation application of currently pending U.S. patent application Ser. No. 12/750,790, filed on Mar. 31, 2010. The application identified above is incorporated herein by reference in its entirety for all that it contains in order to provide continuity of disclosure.

BACKGROUND OF THE INVENTION

The present invention relates generally to electrical assets used within an industrial process and more particularly to presenting unbalance information obtained from the electrical assets onto a user interface in a manner that facilitates improved management of the electrical assets.

An industrial motor is one type of electrical asset that is used within an industrial process. Three-phase motors such as induction motors and synchronous motors are examples of typical motors that are widely used in industrial processes such as a power generation plant. Although generally reliable in operation, a motor failure can adversely affect the productivity of an industrial process. Consequently, motor protection devices such as motor relays and meters have been used to protect industrial motors from failing. In particular, these motor protection devices provide protection against unbalanced loads, excessively high overcurrent faults, undervoltage conditions, overvoltage conditions, mechanical jams and load losses. As technology for motor protection devices has improved, so has the amount of information that these devices are able to obtain. This information not only includes data pertaining to the motors, but also data that relates to the conditions of other loads that share the electrical buses of the motors. Despite the availability of all of the information from these modern motor protection devices, there is no easy way to decipher this information in a manner that can facilitate monitoring and management of these motors while operating within their processes.

BRIEF DESCRIPTION OF THE INVENTION

In one aspect of the present invention, a computer system for presenting unbalance information from a plurality of electrical assets operating in a process is provided. The computer system comprises at least one processing unit; memory operably associated with the at least one processing unit; and an electrical asset management application storable in memory and executable by the at least one processing unit that presents the unbalance information generated from the plurality of electrical assets for management thereof. The electrical asset management application is configured to: generate a visual representation of the plurality of electrical assets operating in the process; partition the plurality of electrical assets in the visual representation into one or more groupings that are each based on a common operational characteristic associated with the plurality of electrical assets; obtain the unbalance information and associate the unbalance information with each of the plurality of electrical assets in the one or more groupings; use the obtained unbalance information to determine the presence of abnormal operation associated with each of the one or more groupings; and display the visual representation of the plurality of electrical assets as partitioned within the one or more groupings, the display further comprising an indication of whether there is a presence of abnormal operation associated with each of the one or more groupings.

In another aspect of the present invention, a method, performed on a computer system, for monitoring a plurality of electrical assets operating in a process is provided. In this aspect of the present invention, the method comprises: using the computer system to perform the following: displaying a screen view that provides a visual representation of the plurality of electrical assets operating in the process; displaying a screen view that facilitates partitioning the plurality of electrical assets in the visual representation into one or more groupings that are each based on a common operational characteristic associated with the plurality of electrical assets; obtaining unbalance information generated from the plurality of electrical assets as each operates in the process; associating the obtained unbalance information with each of the plurality of electrical assets in the one or more groupings; using the obtained unbalance information to determine the presence of abnormal operation associated with each of the one or more groupings; and displaying a screen view that provides the visual representation of the plurality of electrical assets as partitioned within the one or more groupings, the display including an indication of whether there is a presence of abnormal operation associated with each of the one or more groupings.

In a third aspect of the present invention, a non-transitory computer-readable medium storing computer instructions for causing a computer processor to perform a method that presents unbalance information generated from a plurality of electrical assets operating in a process is disclosed. In this aspect of the present invention, the method comprises: generating a visual representation of the plurality of electrical assets operating in the process; partitioning the plurality of electrical assets in the visual representation into one or more groupings that are each based on a common operational characteristic associated with the plurality of electrical assets; obtaining the unbalance information from the plurality of electrical assets as each operates in the process; associating the obtained unbalance information with each of the plurality of electrical assets in the one or more groupings; using the obtained unbalance information to determine the presence of abnormal operation associated with each of the one or more groupings; and generating a screen view that provides the visual representation of the plurality of electrical assets as partitioned within the one or more groupings, the screen view including an indication of whether there is a presence of abnormal operation associated with each of the one or more groupings.

DETAILED DESCRIPTION OF THE INVENTION

Various embodiments of the present invention are directed to obtaining unbalance information generated from electrical assets that operate in a process and presenting this information in a manner that facilitates management of the assets and the process. In one embodiment, the presentation of the unbalance information that facilitates management of the assets and the process includes generating a visual representation of the electrical assets operating in the process. Next, the electrical assets in the visual representation are partitioned into one or more groupings that are each based on a common operational characteristic. The unbalance information generated from the electrical assets is then obtained and associated with each of the assets in the one or more groupings. At least one statistical measure is determined for each of the one or more groupings that is based on the unbalance information associated with each of the electrical assets in the one or more groupings. Then at least one statistical measure provides an indication of the presence of abnormal operation associated with each of the one or more groupings. The visual representation of the electrical assets as partitioned within the one or more groupings is displayed to an operator, along with the unbalance information that is associated with each of the assets in the one or more groupings and the at least one statistical measure that is associated with each of the one or more groupings. Technical effects of the various embodiments of the present invention include improving monitoring and management of these electrical assets while operating in the process. Improved monitoring and management of these electrical assets results in increased productivity of the process, as well as reduced warranty claims on the performance of these assets.

In the various embodiments of the present invention as described herein, the electrical assets are described as industrial electric motors that are used in an industrial process such as a power generation operation. In one embodiment, the electric motors are three-phase motors such as induction motors and synchronous motors. Although the various embodiments of the present invention are described with respect to presenting unbalance information generated from electric motors used in a power generation operation in a manner that facilitates monitoring and management of the motors, the embodiments of the present invention are not limited to use solely with motors that operate in a power generation operation. Those skilled in the art will recognize that the various embodiments of the present invention can be used to manage other electric assets that operate in any process that generates unbalance information or other analogous operational data that can be used to manage and monitor these assets.

Figure 1:
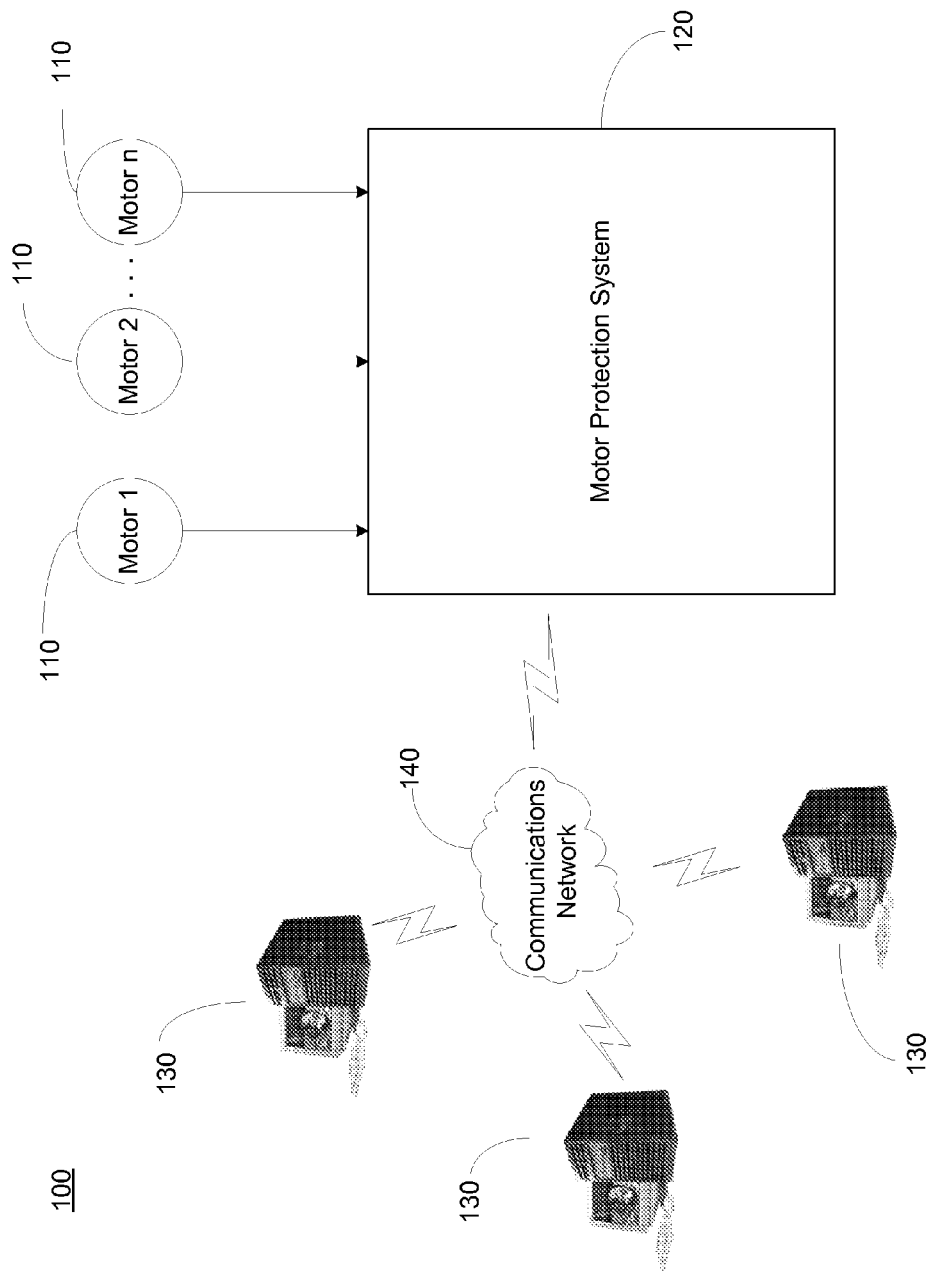
FIG. 1 is a schematic block diagram of a system for managing a motor in an industrial process.

Referring to the drawings, FIG. 1 is a schematic block diagram of a system 100 for managing motors operating in a process. As shown in FIG. 1, system 100 includes motors (i.e., Motor 1, Motor 2 . . . Motor n) 110 that in one embodiment are three-phase motors that operate in a power generation plant. A motor protection system 120 protects motors 110 from failing by protecting against items that may include unbalanced loads, excessively high overcurrent faults, undervoltage conditions, overvoltage conditions, mechanical jams and load losses. Performing these functions as well as other motor protection functionalities are widely well known in the art of motor protection devices and therefore a detailed description of these functions is not provided.

For the sake of simplicity in illustrating embodiments of the present invention, those skilled in the art will recognize that not all features and functionalities associated with using motor protection system 120 are illustrated in FIG. 1. For example, those skilled in the art will appreciate that motor protection system 120 will have inputs and outputs coupled to various sensors and transducers that measure various parameters of the power generation process. In addition, those skilled in the art will recognize that motor protection system 120 would have several inputs for each of the motors 110. An illustrative, but non-exhaustive, listing of inputs would include phase voltage inputs, current inputs and differential inputs. Other inputs could include connections to receive data from the windings and bearings of the motors 110, as well as some of the devices (e.g., pumps, compressors) driven by these motors.

Motor protection system 120 may be any commercially available motor protection device such as an electric meter or relay. One example of a commercially available motor protection device that may be used in system 100 is a 469 Motor Management Relay sold by GE Multilin. Those skilled in the art will recognize that there are other commercially available motor protection devices that perform functions and generate information similar to the 469 Motor Management Relay.

Referring back to FIG. 1, computers 130 connect to the motor protection system 120 via a communications network 140. Computers 130 can be used to perform one of a variety of operations. For example, one computer 130 can be a host computer that is at a remote location that is used to perform remote monitoring and diagnostics of the motors 110, as well as general management of these assets. Another computer 130 may be located locally about the motor protection system 120, so that a plant operator can have closer interaction with the system at the process level. Regardless of where computers 130 are located, they can be used to implement the various embodiments of the present invention. Computers 130 have an electrical asset management application as described herein with respect to the various embodiments of the present invention, that configures the computers to receive unbalance information generated from the motors 110 that is obtained by motor protection system 120 and transform this information in a presentable manner that can be used to monitor and manage (e.g., troubleshoot problems) the motors as well as other assets used in the power generation operation.

For a typical ungrounded three-wire, three-phase motor such as an induction motor, an installer and operator have three wires to connect and operate. Carried within each wire is a phase current measurable with an ammeter and between any two wires is a line-to-line voltage measurable by a voltmeter. For a perfect system, the measured magnitudes of the voltages should equal each other and the measured magnitudes of the current should equal each other. As used herein, "balance" refers to identical line-to-line voltage magnitudes and phase currents.

Unbalanced voltage is a measurable deviation from perfection, defined by the National Electric Manufacturer's Association (NEMA) and the Institute of Electrical and Electronics Engineers (IEEE), to be the absolute value of the largest deviation from the mean, divided by the mean, in percent. For example, NEMA Motors and Generators 1 standard (MG1) gives the example of readings for a 460 volt motor of 460, 450 and 467 volts. The arithmetic average is $\frac{1}{3}(460+450+467)$ =459. The largest deviation from 459 is from 450, with a value of 9. The unbalance voltage percentage is $100 \times (\frac{9}{459})$ =1.96%. Unbalanced voltage causes a number of detrimental effects to an induction motor, including excessive stator currents and rotor currents. Those skilled in the art of motor applications will recognize that voltage unbalance causes negative sequence effects on the rotor correlated to the voltage unbalance at nearly twice line frequency. The nearly 120 Hertz (Hz) currents on a 60 Hz device cause the conducting components of the rotor to generate heat, overloading the cooling capacity of the motor. In addition, a pronounced 120 Hz noise will emanate from the stator core. NEMA standard MG1-2000 states that an unbalance of 1.96% as calculated above causes the motor to run at best 95% of its rating. Further, this standard indicates that a voltage unbalance of 3% reduces the rating to 88% and a voltage unbalance of 4% reduces the rating to 82%, which is well below where an economically sized motor carrying a load at 90% or more would be thermally safe to run.

Unbalanced current is computed in a similar manner using the phase magnitudes. However, modern practice recognizes that for a given voltage unbalance, the current unbalance may be four to six times that value based upon how a symmetrically constructed machine reacts to the imperfect voltage supply. It also recognizes that a lightly loaded motor can withstand imperfection better than a heavily loaded one based upon its cooling system limits. Therefore, unbalanced current is defined herein is:

Unbalanced current=100%×(Maximum deviation Phase Current/Average Current)

If the average current is >=Nameplate Current=Unbalanced current per above x % Nameplate Amps If the average current is <Nameplate Current Typically, the unbalance information generated by the motor protection system 120 is a numerical value of the current balance or voltage unbalance. This information in this form is not very meaningful to an operator for several reasons and thus is not helpful in the monitoring or troubleshooting of motors 110. One reason why the currently available unbalance information is not very meaningful is that there are typically no communications systems available to report the data automatically to a central location. The great number of operators today must interrogate a microprocessor-based relay locally at the motor control center to establish the information. For example, in a conventional system, there is no motor control system. Typically, a relay is slaved to a motor control center and there is no communications. Usually, there is just a set of wires to command "Run" and echoing signals to state "Running" or "Tripped". As a result, the operators must interrogate detailed status information or outputs at the motor protection device to establish operating information. Another reason why the currently available unbalance information is not very meaningful is because, depending upon the age of the technology, the local calculation of unbalance for voltage or current may not be available and the basic values to calculate them may not be outputs of the motor protection device. Many devices only tell the operator why they have tripped a machine without benefit of steady state or pre-trip values.

As described herein, the electric asset management application configured to run on computers 130, is configured to transform the unbalance information in a representation that clearly facilitates the impact this data can have on motors 110 as well as the process in which the motors operate. In particular, the electric asset management application according to various embodiments of the present invention generates a visual representation of motors 110 operating in the process, partitions the motors in this representation into one or more groupings that are each based on a common operational characteristic, associates the respective unbalance information with each of the motors in the one or more groupings and determines at least one statistical measure for each of the one or more groupings that is based on the unbalance information associated with each of the motors in the one or more groupings. The at least one statistical measure provides an indication of the presence of abnormal operation associated with each of the one or more groupings and generates a visual representation this information in a display to an operator.

Figure 2:
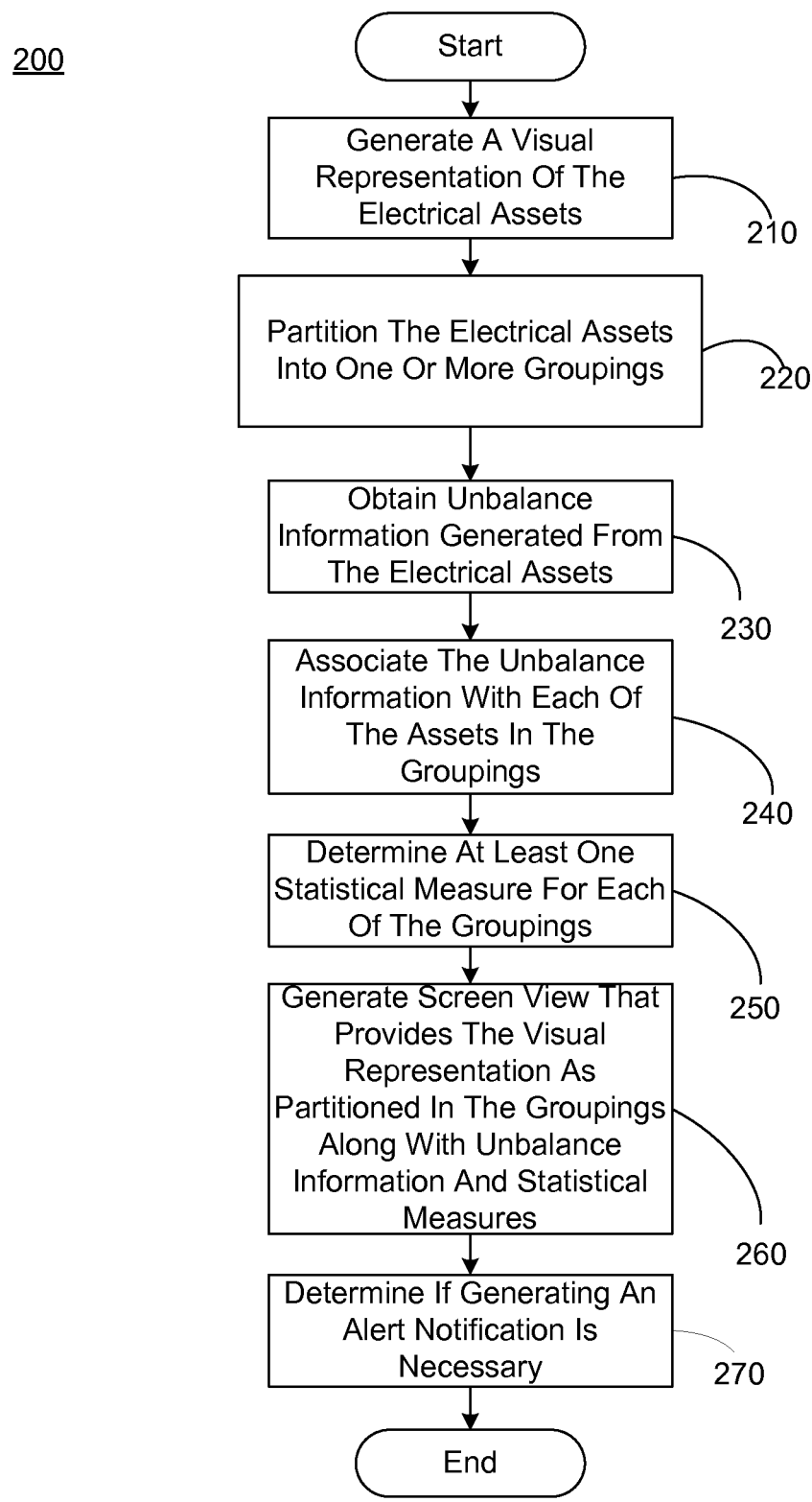
FIG. 2 shows a flow chart illustrating the operation of generating screen views like the ones depicted in FIGS. 3-7 that are used to facilitate management of motors used in an industrial process according to one embodiment of the present invention.

FIG. 2 shows a flow chart 200 illustrating the operation of using the electric asset management application to generate screen views that may be used to facilitate management of motors 110 shown in FIG. 1 according to one embodiment of the present invention. Flow chart 200 of FIG. 2 begins by generating a visual representation of the motors 110 operating in the industrial process at 210. The visual representation is generally a graphical representation of all of the assets operating in the process. The visual representation can be generated earlier using any software package that has the capability to generate graphics. In one embodiment, before the visual representation is generated, a plant engineer could evaluate his or her l-line diagrams to capture motor and non-motor electrical loads (e.g., electric heaters, etc.) that are critical to the process. The output of his or her thought and drawing process would be a l-line diagram such as one shown in FIG. 3.

Figure 3:
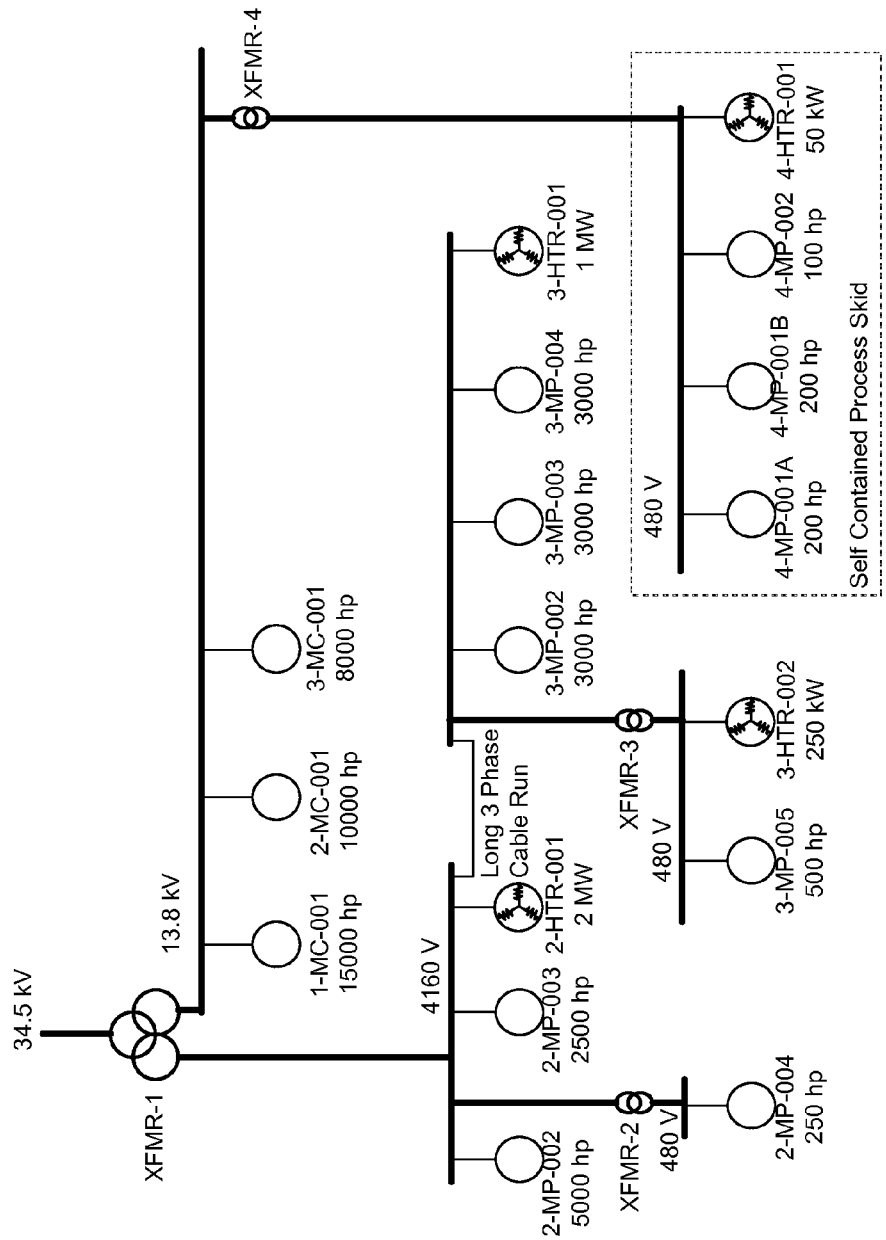
FIG. 3 shows an example of a screen view that may be presented to a user of a computer system like the one shown in FIG. 1 that facilitates management of motors used in an industrial process according to one embodiment of the present invention.

FIG. 3 shows an example of a screen view 300 that may be generated that provides a visual representation of the motors 110 (FIG. 1) operating in the process. In particular, the screen view 300 of FIG. 3 shows the auxiliary machinery of a power generation plant characterized by several sub-processes having motors coupled to a common electrical bus. As shown in the representation of FIG. 3, a 34.5 kilovolt (kV) utility power connects to a three-phase transformer (XFMR-1) that splits this voltage among a primary transformer (i.e., the top circle of XFMR-1) and two secondary transformers (i.e., the right-hand circle and left-hand circle of XFMR-1). In particular, secondary transformer on the right-hand side of XFMR-1 generates a 13.8 kV voltage that is provided along a voltage bus, whereas the secondary transformer on the left-hand side of XFMR-1 generates a 4160 V voltage that is provided along a voltage bus. As shown in FIG. 3, the 13.8 kV voltage bus feeds three very large motor/compressor sets that are used for different processes. In FIG. 3, one motor/compressor set that is in this region is designated by an MC-001. The prefixes 1, 2 and 3 that precede MC-001 are used to designate that each motor/compressor set is used in one of three sub-processes or processes.

The 13.8 kV voltage bus also feeds a self-contained process skid (e.g., a small lube oil supply skid) by a long cable via a step-down transformer (XFMR-4) with fixed taps. As shown in FIG. 3, the self-contained process skid comprises several motor/pump sets. In FIG. 3, the motor/pump sets that are in this region are designated by 4-MP. The suffixes 001A, 001B and 002 designate the motor/pump set used in sub-process or process 4. In addition, the self-contained process skid comprises a small heater (e.g., for oil viscosity control on cold days) that is designated by 4-HTR-001. Sub-process or process 2 comprises motor/pump sets 2-MP-002, 2-MP-003 and 2-MP-004. Note that motor/pump 2-MP-004 receives 480V via a step-down transformer XFMR-2 that reduces the 4160V to the 480V. In addition to the motor/pump sets, process 2 includes a heater represented by 2-HTR-001.

As shown in FIG. 3, sub-process or process 3 is coupled to the 4160 V bus via a long 3-phase cable run. Sub-process or process 3 is shown as comprising a multiple of motor/pump sets 3-MP-002, 3-MP-003, 3-MP-004 and 3-MP-005. Note that motor/pump 3-MP-005 receives 480V via a step-down transformer XFMR-3 that reduces the 4160V to the 480V. In addition to the motor/pump sets, process 3 includes two heaters represented by 3-HTR-001 and 3-HTR-002. Note that heaters 2-HTR-001 3-HTR-001 and 3-HTR-002 may be continuous loads or may have only start-up and shutdown duty depending upon availability of steam to do the same job.

Referring back to flow chart 200 of FIG. 2, the next step is to partition (e.g., arrange, organize, etc.) the motors 110 in the visual representation into one or more groupings at 220. That is, the plant engineer being an individual skilled in the art and understanding unbalance, could now partition his or her work from the generated 1-line diagram (e.g., FIG. 3) by what his or her experience tells indicates is critical. In one embodiment, each of the groupings is based on a common operational characteristic associated with the motors 110. In a first embodiment, the common operational characteristic associated with the motors 110 that is used to partition these assets into one or more groupings is the voltage level of the electric bus that each motor connects thereto. In another embodiment, the common operational characteristic that is used to partition the motors into one or more groupings is the sub-process or process that each of the motors operate within the process. An example of a sub-process or process that could be used to partition the assets includes critical circuit breakers/transformers. Although the description that follows pertains to using the electric bus and sub-process or process to partition the motors 110 into one or more groupings, those skilled in the art will recognize that other operational characteristics may be used to partition the motors. For example, other operational characteristics that may be used to partition the motors may include motors grouped under a particular set of line fuses or any other electrical element within the plant that may fail in an asymmetrical way (i.e., one or two of the three phases may act, but not all three).

In one embodiment, the partitioning of the motors 110 in the visual representation into one or more groupings is generated by laying out graphical lines around the desired portions of the visual representation that are representative of the operational characteristics that form the basis for the groupings. These groupings or partitions may be accomplished one screen per partition using a dashed box, a color coding, or any other visual means provided by a typical graphical software application to designate subset commonality.

Figure 4:
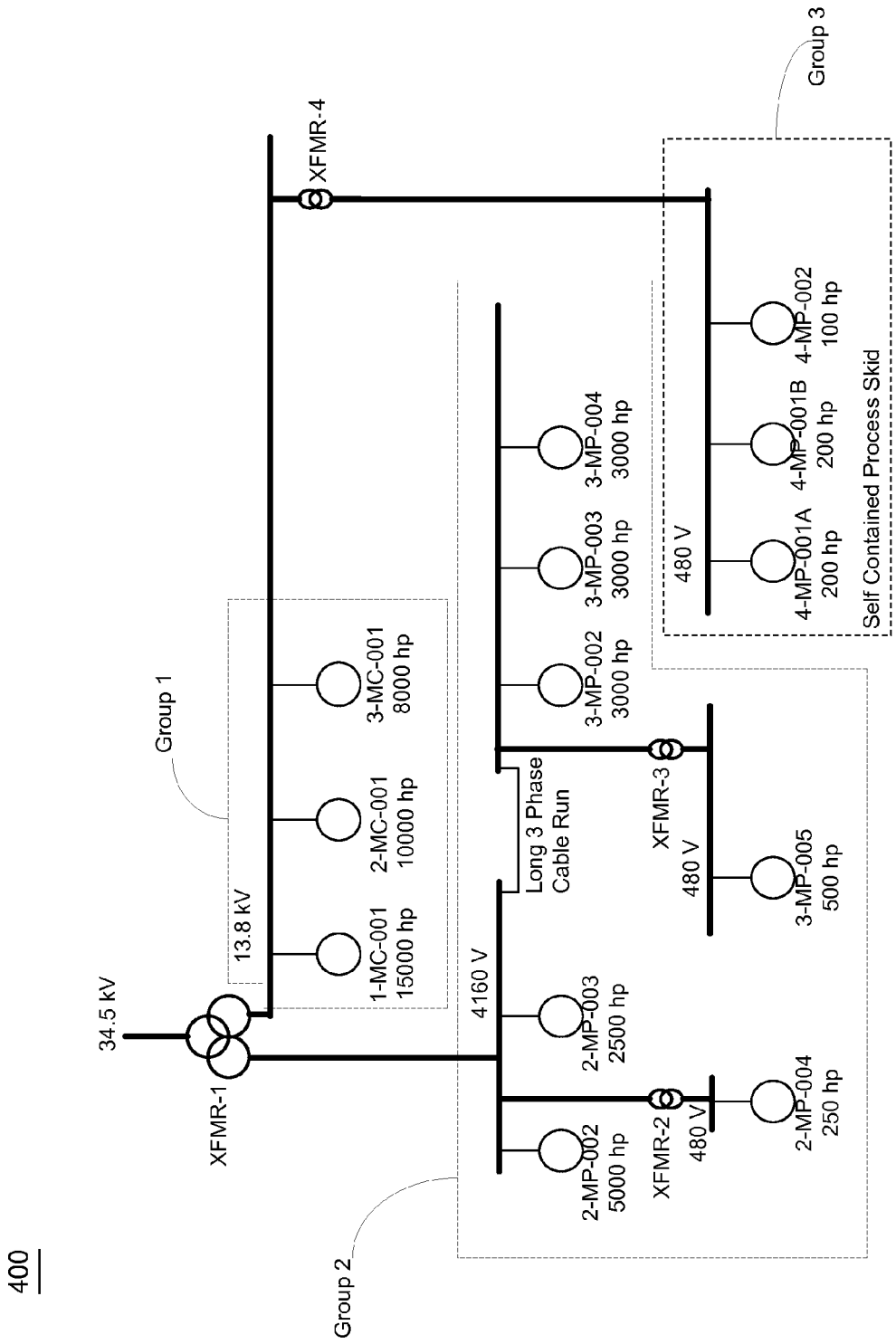
FIG. 4 shows an example of another screen view that may be presented to a user of a computer system like the one shown in FIG. 1 that facilitates management of motors used in an industrial process according to one embodiment of the present invention.

FIG. 4 shows an example of a screen view 400 that may be generated upon partitioning the motors into one or more groupings based on a common operational characteristic. In particular, FIG. 4 shows the partitioning of the motors into groups that are based on the common voltage bus that each motor connects thereto. As shown in FIG. 4, there are three groups; Group 1 is the 13.8 kV bus, Group 2 is the 4160 V bus and Group 3 is the 480 V bus used in the self-contained process skid. In particular, Group 1 includes motor/compressor sets 1-MC-001, 2-MC-001 and 3-MC-001; Group 2 includes motor/pump sets 2-MP-002, 2-MP-003, 2-MP-004, 3-MP-002, 3-MP-003, 3-MP-004 and 3-MP-005; and Group 3 includes motor/pump sets 4-MP-001A, 4-MP-001B and 4-MP-002.

Figure 5:
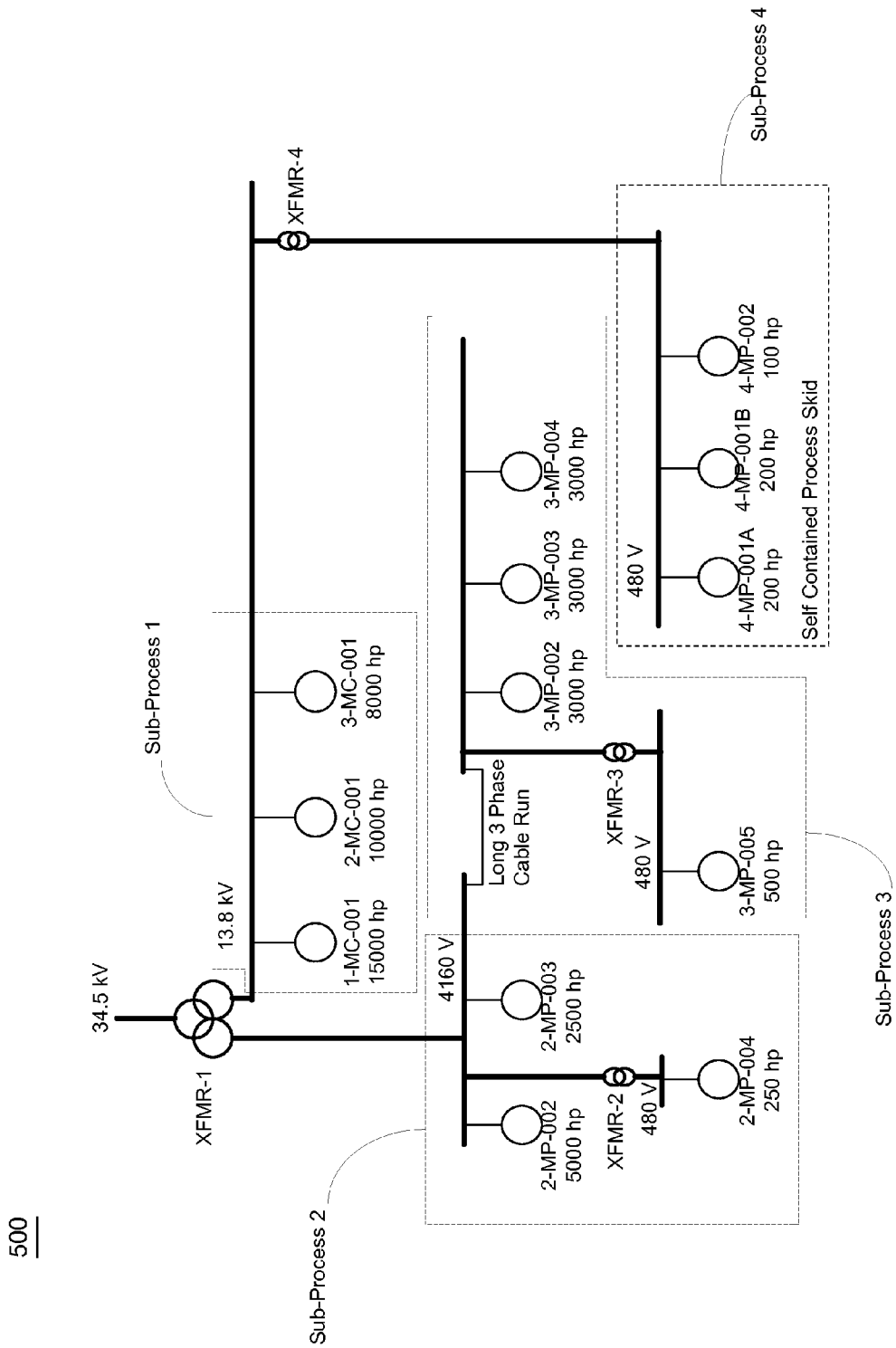
FIG. 5 shows an example of yet another screen view that may be presented to a user of a computer system like the one shown in FIG. 1 that facilitates management of motors used in an industrial process according to one embodiment of the present invention.

FIG. 5 shows another example of a screen view 500 that may be generated upon partitioning the motors into one or more groupings based on a common operational characteristic. In particular, FIG. 5 shows the partitioning of the motors into groups that are based on the common sub-process or process that each motor is within. As shown in FIG. 5, there are four groups; Sub-Process 1 includes motor/compressor sets 1-MC-001, 2-MC-001 and 3-MC-001; Sub-Process 2 includes motor/pump sets 2-MP-002 and 2-MP-003 coupled to the 4160V bus and 2-MP-004 coupled to the 480 V bus which is coupled to the 4160V bus via the step-down transformer (XFMR-2); Sub-Process 3 includes motor/pump sets 3-MP-002, 3-MP-003 and 3-MP-004 coupled to the 4160V bus and 3-MP-005 coupled to the 480 V bus which is coupled to the 4160V bus via the step-down transformer (XFMR-3); and Sub-Process 4 includes motor/pump sets 4-MP-001A, 4-MP-001B and 3-MP-002. As shown in FIG. 5, the processes are segregated only at the 4160 V bus and lower due to the large "singleton" 13.8 kV motors that are best addressed at the bus level. Since processes generally tend to occur in spatial groups or skids, these can be grouped to monitor for trends. In the example shown in FIG. 5, if the main feed from transformer XFMR-1 to the 4160V bus were in distress, Sub-Process 2 would best catch it. However, if the long feeder to Sub-Process 3 from Sub-Process 2 is misconnected or damaged over time, it warrants Sub-Process 3 having its own summary statistics for observation. By similar reasoning, Sub-Process 4 needs to be monitored at the end of its cable.

Note that in both FIGS. 4 and 5, the heaters (i.e., 2-HTR-001, 3-HTR-001, 3 HTR-002 and 4-HTR-001) are not shown since they typically have no real-time instrumentation. Also, note that the 480V transformers (XFMR-2 and XFMR-3) and their loads are grouped with the 4160 V bus. This is done because the transformers are assumed to have fixed taps and are balanced. If they were tap-changing under load and had the ability to hang a phase's tap, they would be designated as separate groups.

Referring back to flow chart 200 in FIG. 2, the next step is to obtain the unbalance information generated from the motors 110 (FIG. 1) at 230 while in operation from the motor protection system 120 (FIG. 1). In one embodiment, the obtaining of the unbalance information from the motor protection system is performed by any one of currently available electronic communications systems (not shown), e.g., Modbus, Prophibus, Foundation Field Bus, Ethernet, etc. Depending upon the sophistication of the system, a relay may only transmit to or may send and receive data from a communications circuit in a computer system, the latter being typically used in more modern methods.

After obtaining the unbalance information, the electric asset management application then associates the respective unbalance information with each of motors 110 (FIG. 1) in the one or more partitioned groups at 240. In particular, the electric asset management application maps the unbalance information generated from each motor (FIG. 1) that was received by the motor protection system 120 (FIG. 1) to the partitioned grouping that contains that respective motor. In one embodiment, the associating of the unbalance information from the motor protection system to the partitioned grouping containing that motor is performed by attributes assigning of the data from the communications system to variable names with the computer 130 (FIG. 1).

With the unbalance information associated with each of the motors in their respective partitioned groupings, the electric asset management application can determine at least one statistical measure for each of the one or more groupings at 250 in order to determine if there is abnormal operation in a group. The at least one statistical measure is based on the unbalance information associated with each of motors 110 (FIG. 1) in the one or more partitioned groups. In one embodiment, the at least one statistical measure may comprise a measure of central tendency such as the mean, mode or median, and a measure of spread in values, such as a range or standard deviation, or coefficient of variation (e.g., standard deviation and mean that is dimensionless). Those skilled in the art will recognize that any one of a number of statistical measures can be determined and that the various embodiments of the present invention should not be limited to any particular measure. Other examples of possible statistical measures that can be computed include median and mode for the measure of central tendency and range for variability.

In the various embodiments of the present invention, the at least one statistical measure could be determined by using the mathematical processor within the computer 130 (FIG. 1). As an example, a simple arithmetic mean of Group 1 in FIG. 4 could be determined in the following manner where N=3:

Average Voltage Unbalance of Group 1=1/$N$×(Voltage Unbalance (1-MC-001)+Voltage Unbalance (2-MC-001)+Voltage Unbalance (3-MC-001))

A statistical measure that captures variability in this example could be determined as:

Standard Deviation of Group 1=square root of (((Voltage Unbalance (1-MC-001)−Average)^2+(Voltage Unbalance (2-MC-001)−Average)^2+(Voltage Unbalance (3-MC-001))−Average)^2))/($N$−1)), where "Average"=Average Voltage Unbalance of Group 1.

Referring back to FIG. 2, after generating the at least one statistical measure, the electric asset management application generates a screen view at 260 that provides the visual representation of the motors as partitioned within the one or more groupings, the unbalance information associated with each of the motors in the one or more groupings and the at least one statistical measure associated with each of the groupings. In one embodiment, this type of screen view is generated by the use of screen graphics provided by a typical graphical software application. In one embodiment, the lines forming the grouping would be static, however, the statistics associated with the groupings would be constantly updated at the standard screen refresh interval. Depending upon how extraordinary events are handled, the screen graphics could also change colors of borders or regions (e.g., change from yellow or red) to indicate a severe condition.

Figure 6:
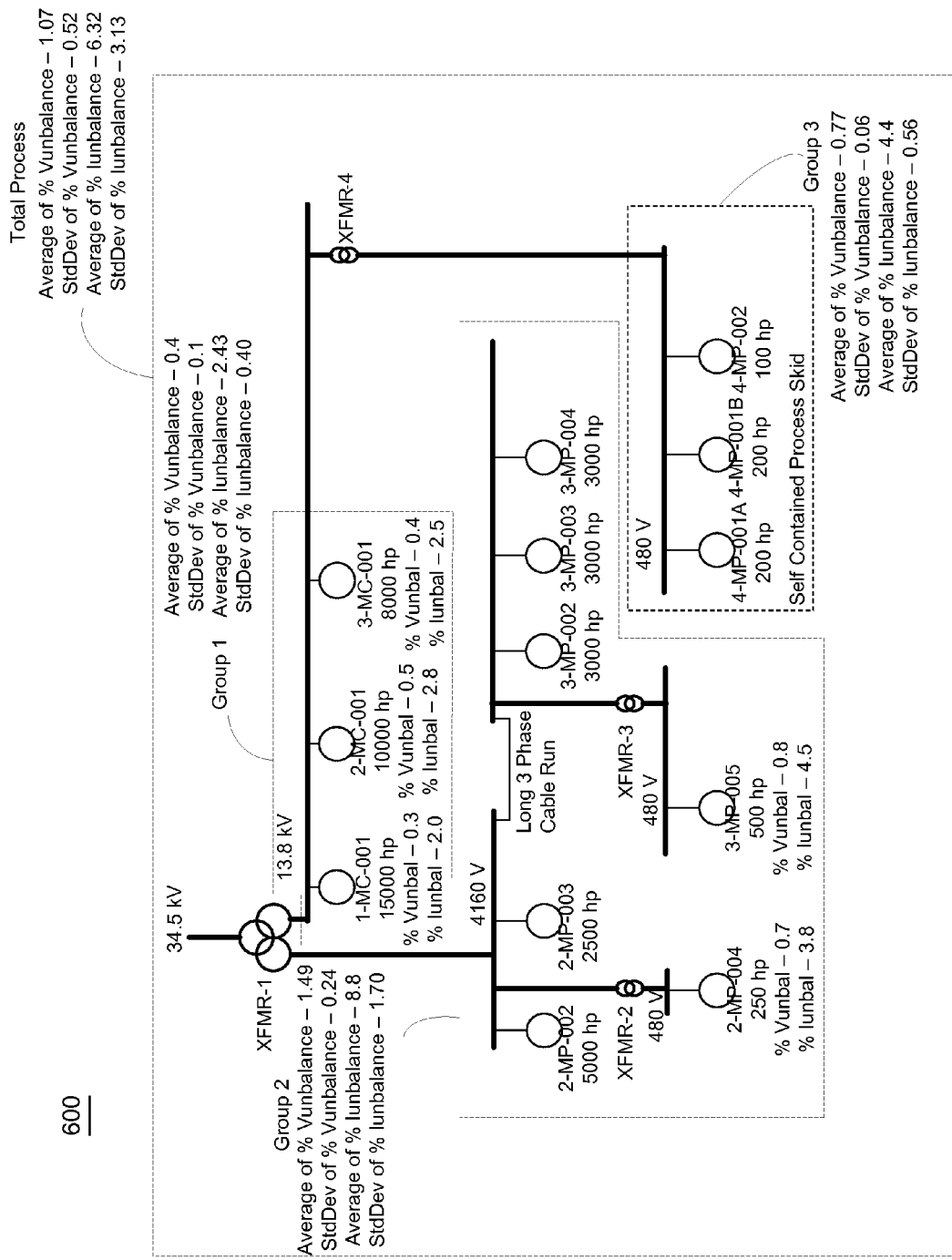
FIG. 6 show an example of still another screen view that may be presented to a user of a computer system like the one shown in FIG. 1 that facilitates management of motors used in an industrial process according to one embodiment of the present invention.
Figure 7:
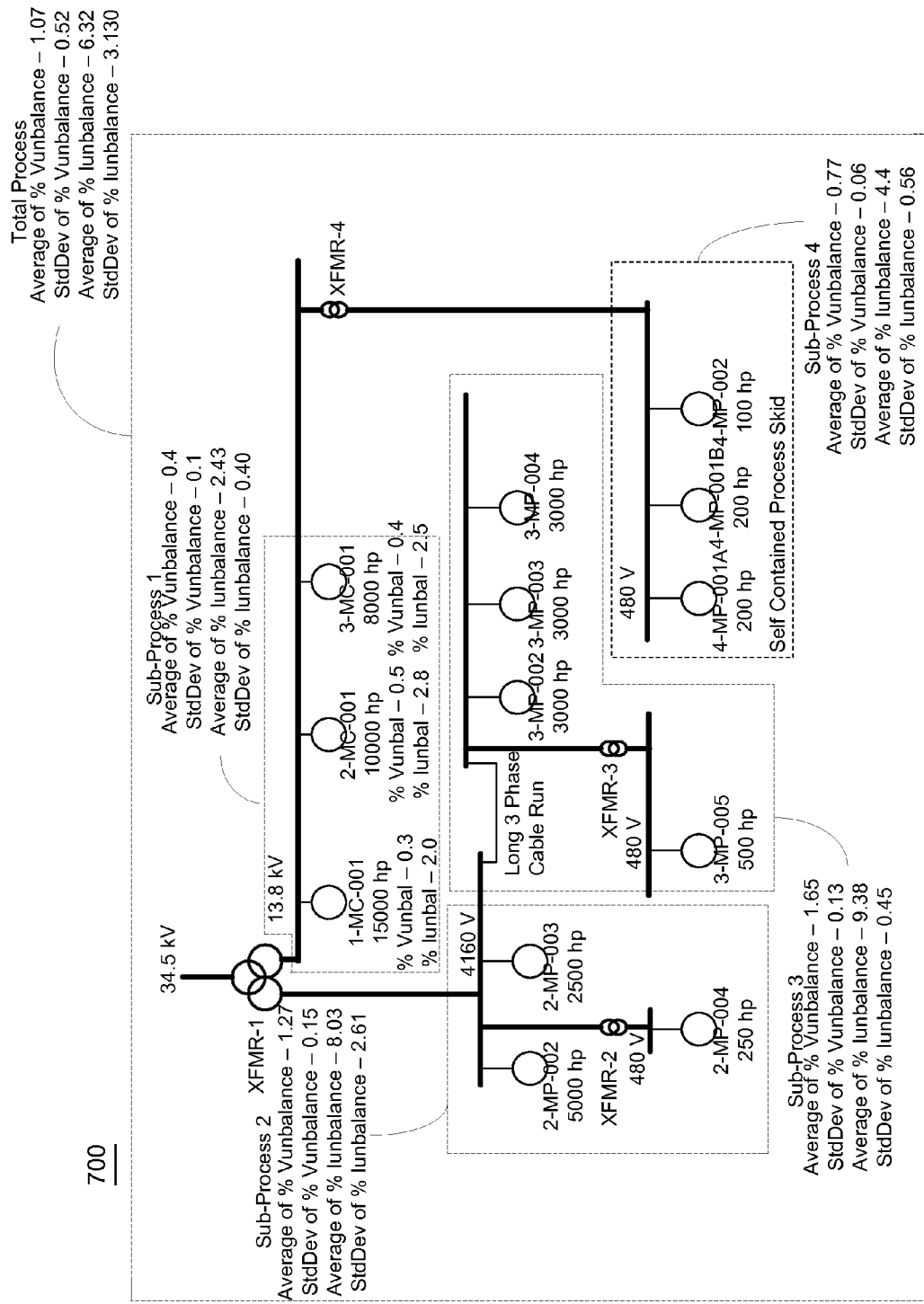
FIG. 7 show an example of yet another screen view that may be presented to a user of a computer system like the one shown in FIG. 1 that facilitates management of motors used in an industrial process according to one embodiment of the present invention.

FIGS. 6 and 7 show examples of screen views 600 and 700, respectively that may be generated by the electric asset management application upon determining the at least one statistical measure. In particular, FIGS. 6 and 7 show the voltage and current unbalance associated with each of the partitioned groups. More specifically, FIG. 6 shows that Group 1 has an average percentage of voltage unbalance of 0.4, a standard deviation of percentage voltage unbalance of 0.1, an average of percentage of current unbalance of 2.43 and a standard deviation of percentage of current unbalance of 0.40; Group 2 has an average percentage of voltage unbalance of 1.49, a standard deviation of percentage voltage unbalance of 0.24, an average of percentage of current unbalance of 8.8 and a standard deviation of percentage of current unbalance of 1.70; Group 3 has an average percentage of voltage unbalance of 0.77, a standard deviation of percentage voltage unbalance of 0.06, an average of percentage of current unbalance of 4.4 and a standard deviation of percentage of current unbalance of 0.56; and for the total overall process there is an average percentage of voltage unbalance of 1.07, a standard deviation of percentage voltage unbalance of 0.52, an average of percentage of current unbalance of 6.32 and a standard deviation of percentage of current unbalance of 3.13. FIG. 7 shows that Sub-Process 1 has an average percentage of voltage unbalance of 0.4, a standard deviation of percentage voltage unbalance of 0.1, an average of percentage of current unbalance of 2.43 and a standard deviation of percentage of current unbalance of 0.40; Sub-Process 2 has an average percentage of voltage unbalance of 1.27, a standard deviation of percentage voltage unbalance of 0.15, an average of percentage of current unbalance of 8.03 and a standard deviation of percentage of current unbalance of 2.61; Sub-Process 3 has an average percentage of voltage unbalance of 1.65, a standard deviation of percentage voltage unbalance of 0.13, an average of percentage of current unbalance of 9.38 and a standard deviation of percentage of current unbalance of 0.45; Sub-Process 4 has an average percentage of voltage unbalance of 0.77, a standard deviation of percentage voltage unbalance of 0.06, an average of percentage of current unbalance of 4.4 and a standard deviation of percentage of current unbalance of 0.56; and for the total overall process there is an average percentage of voltage unbalance of 1.07, a standard deviation of percentage voltage unbalance of 0.52, an average of percentage of current unbalance of 6.32 and a standard deviation of percentage of current unbalance of 3.13.

FIGS. 6 and 7 further show individual voltage unbalance information and current unbalance information associated with motors in a grouping. In particular, FIG. 6 shows that in Group 1, motor/compressor set 1-MC-001 has a percentage of voltage unbalance of 0.3 and a percentage of current unbalance of 2.0; motor/compressor set 2-MC-001 has a percentage of voltage unbalance of 0.5 and a percentage of current unbalance of 2.8; motor/compressor set 3-MC-001 has a percentage of voltage unbalance of 0.4 and a percentage of current unbalance of 2.5; motor/pump set 2-MP-004 has a percentage of voltage unbalance of 0.7 and a percentage of current unbalance of 3.8; and motor/pump set 3-MP-005 has a percentage of voltage unbalance of 0.8 and a percentage of current unbalance of 4.5. FIG. 7 shows that in Group 1, motor/compressor set 1-MC-001 has a percentage of voltage unbalance of 0.3 and a percentage of current unbalance of 2.0; motor/compressor set 2-MC-001 has a percentage of voltage unbalance of 0.5 and a percentage of current unbalance of 2.8; and motor/compressor set 3-MC-001 has a percentage of voltage unbalance of 0.4 and a percentage of current unbalance of 2.5. Although FIGS. 6 and 7 do not show the individual voltage unbalance information and current unbalance information associated with each motor, those skilled in the art will recognize that this information could be listed beside each individual motor in a grouping.

Those skilled in the art will recognize that these screen views are only examples of how unbalance information and statistical measures may be presented to an operator using the electric asset management application running on computers 130 (FIG. 1) and that there other manners of presenting this information as well other statistical measures that can be provided to the operator.

Referring back to FIG. 2, the statistical measures are used at 270 to determine if it is necessary to generate an alert notification that requests that the operator investigate further into the operating condition of the motors. In one embodiment, the generated statistical measures can be compared to predetermined threshold limits to determine if it is necessary to generate an alert notification. If any one of the measures exceeds the predetermined threshold limits then relays coupled to the motors can be automatically tripped so that the operator can investigate further into why the measures exceeded the thresholds (e.g., this may be suitable in scenarios where there is severe unbalance). In another embodiment, a notification can be sent to the operator indicating that a statistical measure has exceeded a predetermined threshold limit. In this embodiment, those skilled in the art will recognize that the notification can be provided through one of many possible notification mediums. For example, the notification can be audible (e.g., an alarm), visual (e.g., notifications indicating the type of distress (e.g., red lights provided on a status display indicating a serious condition and yellow lights indicating a potential issue)), textual (e.g., an email in color coded text) or combinations of both. After receiving any one of these notifications, the plant operator can take appropriate action to initiate an investigation as to why the predetermined threshold limits were exceeded.

With information presented in this manner, an operator is better situated to monitor and manage the motors as well as the entire process in which the motors are operating within. For example, an operator referring to FIGS. 4 and 6 (grouping by voltage bus), could use these screen views to identify a problem attached to the voltage bus. For instance, if all running motors attached to a voltage bus are indicating the same approximate voltage unbalance, then it is likely that the problem is not a motor issue, but due to another large load on that bus. Thus, post-processing the unbalance information with a mean and standard deviation by voltage bus will help the operator or other system software to quickly identify a system problem unrelated to the individual motors. Similarly, an operator referring to FIGS. 5 and 7 (grouping by sub-process), could use these screen views to identify a failure within a sub-process or pre-packaged unit within the power generation plant. If for example the mean moves slightly and the variability is large, then a single motor is likely in trouble and needs to be visited by a plant technician. If for example, the average of all of the motors in a process were high and the standard deviation was low, then this would be an indication to the operator that there are no problems with motors 110 (FIG. 1) and that the problem is likely due to some other component in the industrial process. For example, the heaters or other large loads that are a significant fraction of the motor load may have become unbalanced due to degradation or a misconnection. The scenarios that embodiments of the present invention can be used to explain or identify failures with motors 110 (FIG. 1) or the entire power generation process with the unbalance information are plentiful and cannot all be described herein, although it is intended that those skilled in the art could use the teachings herein to recognize and identify these failures.

The foregoing flow chart of FIG. 2 shows some of the processing functions associated with generating screens that present unbalance information in a manner that facilitates monitoring and management of motors in an industrial process. In this regard, each block represents a process act associated with performing these functions. It should also be noted that in some alternative implementations, the acts noted in the blocks may occur out of the order noted in the figure or, for example, may in fact be executed substantially concurrently or in the reverse order, depending upon the act involved. Also, one of ordinary skill in the art will recognize that additional blocks that describe the processing functions may be added.

In various embodiments of the present invention, computers 130 can take the form of an entirely hardware embodiment, an entirely software embodiment or an embodiment containing both hardware and software elements. In a preferred embodiment, the processing functions performed by electric asset management application running on computer 130 are implemented in software, which includes but is not limited to firmware, resident software, microcode, etc.

Furthermore, the processing functions performed by the electric asset management application running on the computer 130 can take the form of a computer program product accessible from a computer-usable or computer-readable medium providing program code for use by or in connection with a computer or any instruction execution system. For the purposes of this description, a computer-usable or computer readable medium can be any computer readable storage medium that can contain or store the program for use by or in connection with the computer, instruction execution system, apparatus, or device or a computer readable transmission medium that can communicate, propagate or transport the program for use by or in connection with the computer, instruction execution system, apparatus, or device.

The computer readable medium can be an electronic, magnetic, optical, electromagnetic, infrared, or semiconductor system (or apparatus or device) or a propagation medium. Examples of a computer-readable medium include a semiconductor or solid state memory, magnetic tape, a removable computer diskette, a random access memory (RAM), a read-only memory (ROM), a rigid magnetic disk and an optical disk. Current examples of optical disks include a compact disk-read only memory (CD-ROM), a compact disk-read/write (CD-R/W) and a digital video disc (DVD).

While the disclosure has been particularly shown and described in conjunction with a preferred embodiment thereof, it will be appreciated that variations and modifications will occur to those skilled in the art. Therefore, it is to be understood that the appended claims are intended to cover all such modifications and changes as fall within the true spirit of the disclosure.

What is claimed is:

1. A computer system for presenting unbalance information from a plurality of electrical assets operating in a process, the computer system comprising:
    at least one processing unit;
    memory operably associated with the at least one processing unit; and
    an electrical asset management application storable in memory and executable by the at least one processing unit that presents the unbalance information generated from the plurality of electrical assets for management thereof, the electrical asset management application configured to:
        generate a visual representation of the plurality of electrical assets operating in the process;
        partition the plurality of electrical assets in the visual representation into one or more groupings that are each based on a common operational characteristic associated with the plurality of electrical assets;
        obtain the unbalance information and associate the unbalance information with each of the plurality of electrical assets in the one or more groupings;
        use the obtained unbalance information to determine the presence of abnormal operation associated with each of the one or more groupings; and display the visual representation of the plurality of electrical assets as partitioned within the one or more groupings, the display further comprising an indication of whether there is a presence of abnormal operation associated with each of the one or more groupings.

2. The computer system according to claim 1, wherein the common operational characteristic associated with the plurality of electrical assets that is used to partition the assets into one or more groupings comprises voltage of an electrical bus that each of the plurality of electrical assets connect therewith or a sub-process that each of the plurality of electrical assets operate within.

3. The computer system according to claim 1, wherein the using of the obtained unbalance information to determine the presence of abnormal operation associated with each of the one or more groupings comprises determining at least one statistical measure for each of the one or more groupings that is based on the unbalance information associated with each of the plurality of electrical assets in the one or more groupings.

4. The computer system according to claim 3, wherein the at least one statistical measure comprises a measure of central tendency of the unbalance information of the electrical assets within each of the one or more groupings and a measure of spread of the unbalance information of the electrical assets within each of the one or more groupings.

5. The computer system according to claim 3, wherein the electrical asset management application is further configured to determine if the at least one statistical measure warrants generating a notification indicating the presence of operational issues associated with any one of the plurality of electrical assets.

6. The computer system according to claim 1, wherein the unbalance information comprises voltage unbalance, and wherein the electrical asset management application is further configured to determine the current unbalance from the voltage unbalance.

7. The computer system according to claim 6, wherein the electrical asset management application is further configured to display the current unbalance and the voltage unbalance that is associated with each of the plurality of electrical assets in each of the one or more groupings.

8. A method, performed on a computer system, for monitoring a plurality of electrical assets operating in a process, the method comprising:
using the computer system to perform the following:
displaying a screen view that provides a visual representation of the plurality of electrical assets operating in the process;
displaying a screen view that facilitates partitioning the plurality of electrical assets in the visual representation into one or more groupings that are each based on a common operational characteristic associated with the plurality of electrical assets;
obtaining unbalance information generated from the plurality of electrical assets as each operates in the process;
associating the obtained unbalance information with each of the plurality of electrical assets in the one or more groupings;
using the obtained unbalance information to determine the presence of abnormal operation associated with each of the one or more groupings; and
displaying a screen view that provides the visual representation of the plurality of electrical assets as partitioned within the one or more groupings, the display including an indication of whether there is a presence of abnormal operation associated with each of the one or more groupings.

9. The method according to claim 8, wherein the common operational characteristic associated with the plurality of electrical assets that is used to partition the assets into one or more groupings comprises voltage of an electrical bus that each of the plurality of electrical assets connect therewith or a sub-process that each of the plurality of electrical assets operate within.

10. The method according to claim 8, wherein the using of the obtained unbalance information to determine the presence of abnormal operation associated with each of the one or more groupings comprises determining at least one statistical measure for each of the one or more groupings that is based on the unbalance information associated with each of the plurality of electrical assets in the one or more groupings.

11. The method according to claim 10, wherein the at least one statistical measure comprises a measure of central tendency of the unbalance information of the electrical assets within each of the one or more groupings and a measure of spread of the unbalance information of the electrical assets within each of the one or more groupings.

12. The method according to claim 10, further comprising determining if the at least one statistical measure warrants generating a notification indicating the presence of operational issues associated with any one of the plurality of electrical assets.

13. The method according to claim 8, wherein the unbalance information comprises voltage unbalance.

14. The method according to claim 13, further comprising determining the current unbalance from the voltage unbalance and displaying a screen view that provides the current unbalance and the voltage unbalance that is associated with each of the plurality of electrical assets in each of the one or more groupings.

15. A non-transitory computer-readable medium storing computer instructions for causing a computer processor to perform a method that presents unbalance information generated from a plurality of electrical assets operating in a process, the method comprising:
generating a visual representation of the plurality of electrical assets operating in the process;
partitioning the plurality of electrical assets in the visual representation into one or more groupings that are each based on a common operational characteristic associated with the plurality of electrical assets;
obtaining the unbalance information from the plurality of electrical assets as each operates in the process;
associating the obtained unbalance information with each of the plurality of electrical assets in the one or more groupings;
using the obtained unbalance information to determine the presence of abnormal operation associated with each of the one or more groupings; and
generating a screen view that provides the visual representation of the plurality of electrical assets as partitioned within the one or more groupings, the screen view including an indication of whether there is a presence of abnormal operation associated with each of the one or more groupings.

16. The non-transitory computer-readable medium according to claim 15, wherein the common operational characteristic associated with the plurality of electrical assets that is used to partition the assets into one or more groupings comprises voltage of an electrical bus that each of the plurality of electrical assets connect therewith or a sub-process that each of the plurality of electrical assets operate therein.

17. The non-transitory computer-readable medium according to claim 15, wherein the using of the obtained unbalance information to determine the presence of abnormal operation associated with each of the one or more groupings comprises determining at least one statistical measure for each of the one or more groupings that is based on the unbalance information associated with each of the plurality of electrical assets in the one or more groupings.

18. The non-transitory computer-readable medium according to claim 17, wherein the at least one statistical measure comprises a measure of central tendency of the unbalance information of the electrical assets within each of the one or more groupings and a measure of spread of the unbalance information of the electrical assets within each of the one or more groupings.

19. The non-transitory computer-readable medium according to claim 15, wherein the unbalance information comprises voltage unbalance.

20. The non-transitory computer-readable medium according to claim 19, further comprising determining the current unbalance from the voltage unbalance and displaying a screen view that provides the current unbalance and the voltage unbalance that is associated with each of the plurality of electrical assets in each of the one or more groupings.

\* \* \* \* \*